US010937361B2

(12) United States Patent
Hughes et al.

(10) Patent No.: US 10,937,361 B2
(45) Date of Patent: Mar. 2, 2021

(54) SUB-PIXEL FOR A DISPLAY WITH CONTROLLABLE VIEWING ANGLE (71) Applicant: Facebook Technologies, LLC, Menlo Park, CA (US)

(72) Inventors: Padraig Hughes, Berrings (IE); Joseph O'Keeffe, Fermoy (IE); William Henry, Templeogue (IE)

(73) Assignee: Facebook Technologies, LLC, Menlo Park, CA (US)

( * ) Notice: Subject to any disclaimer, the term of this patent is extended or adjusted under 35 U.S.C. 154(b) by 175 days.

(21) Appl. No.: 15/520,693

(22) PCT Filed: Oct. 22, 2015

(86) PCT No.: PCT/EP2015/074545
§ 371 (c)(1),
(2) Date: Apr. 20, 2017

(87) PCT Pub. No.: WO2016/062834
PCT Pub. Date: Apr. 28, 2016

(65) Prior Publication Data
US 2017/0316736 A1    Nov. 2, 2017

(30) Foreign Application Priority Data
Oct. 22, 2014   (GB) .................................... 1418810

(51) Int. Cl.
G09G 3/32      (2016.01)
H01L 25/075    (2006.01)
(Continued)

(52) U.S. Cl.
CPC ............. *G09G 3/32* (2013.01); *H01L 25/048* (2013.01); *H01L 25/0753* (2013.01);
(Continued)

(58) Field of Classification Search
None
See application file for complete search history.

(56) References Cited

U.S. PATENT DOCUMENTS 7,068,291 B1 * 6/2006 Roberts ..................... G06F 3/14
                                                     345/635
7,518,149 B2    4/2009 Maaskant et al.
(Continued)

FOREIGN PATENT DOCUMENTS

CN    1689063 A    10/2005
CN    1779765 A    5/2006
(Continued)

OTHER PUBLICATIONS

PCT International Search Report and Written Opinion, PCT/EP2015/074545, dated Apr. 28, 2016, 16 pgs.
(Continued)

Primary Examiner — Patrick N Edouard
Assistant Examiner — Peijie Shen
(74) Attorney, Agent, or Firm — Fenwick & West LLP (57) ABSTRACT A sub-pixel for an LED display, the sub-pixel comprising a first light emitting device having a first emission beam angle and a second light emitting device having a second beam angle, the second emission beam angle being different to the first emission beam angle. There is also described a display using a plurality of the sub-pixels.

15 Claims, 6 Drawing Sheets (51) Int. Cl.
*H01L 25/04* (2014.01)
*H01L 51/52* (2006.01)
*H01L 27/32* (2006.01)
*H01L 25/16* (2006.01)
*H01L 27/12* (2006.01)
*H01L 33/10* (2010.01)
*H01L 33/20* (2010.01)
*H01L 33/58* (2010.01)

(52) U.S. Cl.
CPC . *G09G 2300/0452* (2013.01); *G09G 2300/06* (2013.01); *G09G 2300/08* (2013.01); *G09G 2320/068* (2013.01); *G09G 2330/021* (2013.01); *G09G 2354/00* (2013.01); *G09G 2358/00* (2013.01); *G09G 2360/144* (2013.01); *H01L 25/167* (2013.01); *H01L 27/1214* (2013.01); *H01L 27/3213* (2013.01); *H01L 33/10* (2013.01); *H01L 33/20* (2013.01); *H01L 33/58* (2013.01); *H01L 51/5262* (2013.01); *H01L 51/5275* (2013.01); *H01L 2924/0002* (2013.01)

(56) References Cited

U.S. PATENT DOCUMENTS

| | | | |
|---|---|---|---|
| 8,791,474 | B1 | 7/2014 | Bibl et al. |
| 8,922,480 | B1* | 12/2014 | Freed ............ G06F 21/60 345/156 |
| 9,000,466 | B1 | 4/2015 | Aldaz et al. |
| 9,048,396 | B2 | 6/2015 | Lowes et al. |
| 9,348,160 | B2* | 5/2016 | Hsu ............ G02F 1/133606 |
| 2002/0063258 | A1 | 5/2002 | Motoki |
| 2002/0084952 | A1 | 7/2002 | Morley et al. |
| 2003/0034992 | A1 | 2/2003 | Brown Elliott et al. |
| 2004/0150651 | A1 | 8/2004 | Phan |
| 2005/0167682 | A1 | 8/2005 | Fukasawa |
| 2006/0012985 | A1 | 1/2006 | Archie et al. |
| 2006/0092644 | A1 | 5/2006 | Mok et al. |
| 2006/0214566 | A1 | 9/2006 | Moriyama et al. |
| 2006/0290870 | A1 | 12/2006 | Kwak et al. |
| 2007/0013304 | A1 | 1/2007 | Kaneko et al. |
| 2007/0040780 | A1* | 2/2007 | Gass ............ G02F 1/134363 345/87 |
| 2007/0114930 | A1 | 5/2007 | Lee |
| 2007/0153197 | A1* | 7/2007 | Park ............ G02F 1/134363 349/141 |
| 2007/0223219 | A1 | 9/2007 | Medendorp et al. |
| 2007/0236134 | A1 | 10/2007 | Ho et al. |
| 2008/0143911 | A1 | 6/2008 | Jin et al. |
| 2008/0158097 | A1 | 7/2008 | Guo |
| 2008/0304536 | A1 | 12/2008 | Gold et al. |
| 2009/0109172 | A1 | 4/2009 | Lee et al. |
| 2009/0302331 | A1 | 12/2009 | Smith et al. |
| 2010/0079426 | A1* | 4/2010 | Pance ............ G06T 11/001 345/207 |
| 2010/0259166 | A1 | 10/2010 | Cok et al. |
| 2010/0264445 | A1 | 10/2010 | Niki et al. |
| 2010/0317132 | A1* | 12/2010 | Rogers ............ H01L 33/486 438/27 |
| 2010/0321395 | A1* | 12/2010 | Maciesowicz ............ G06F 3/14 345/502 |
| 2011/0012820 | A1 | 1/2011 | Kim et al. |
| 2011/0062457 | A1 | 3/2011 | Naito et al. |
| 2011/0105185 | A1 | 5/2011 | Heald |
| 2011/0175936 | A1 | 7/2011 | Smith |
| 2011/0211337 | A1 | 9/2011 | Ito et al. |
| 2011/0233575 | A1 | 9/2011 | Huang et al. |
| 2011/0284881 | A1* | 11/2011 | Shikina ............ G09G 3/3233 257/88 |
| 2011/0299044 | A1* | 12/2011 | Yeh ............ H04N 9/315 353/52 |
| 2011/0315999 | A1 | 12/2011 | Sharma et al. |
| 2012/0081279 | A1* | 4/2012 | Greenebaum ............ G09G 5/02 345/156 |
| 2012/0223875 | A1 | 9/2012 | Lau et al. |
| 2012/0307191 | A1 | 12/2012 | Park et al. |
| 2013/0075769 | A1 | 3/2013 | Yan et al. |
| 2013/0235590 | A1 | 9/2013 | Van Der Sijde et al. |
| 2013/0321477 | A1 | 12/2013 | Gandhi et al. |
| 2013/0328073 | A1 | 12/2013 | Lowes et al. |
| 2013/0328878 | A1* | 12/2013 | Stahl ............ G06T 3/40 345/428 |
| 2014/0027795 | A1* | 1/2014 | Reiherzer ............ H01L 33/508 257/88 |
| 2014/0055349 | A1* | 2/2014 | Itoh ............ G06F 3/005 345/156 |
| 2014/0062301 | A1 | 3/2014 | Sung |
| 2014/0063853 | A1 | 3/2014 | Nichol et al. |
| 2014/0092142 | A1* | 4/2014 | Boelter ............ G09G 5/00 345/672 |
| 2014/0118255 | A1* | 5/2014 | Billerbeck ............ G06F 3/0304 345/158 |
| 2014/0159043 | A1 | 6/2014 | Sakariya et al. |
| 2014/0240344 | A1* | 8/2014 | Tomono ............ G09G 5/00 345/619 |
| 2014/0267683 | A1 | 9/2014 | Bibl et al. |
| 2014/0353645 | A1 | 12/2014 | Jeong et al. |
| 2014/0353694 | A1* | 12/2014 | Pang ............ H01L 24/97 257/89 |
| 2014/0367633 | A1 | 12/2014 | Bibl et al. |
| 2014/0367713 | A1 | 12/2014 | Zhang et al. |
| 2015/0023016 | A1 | 1/2015 | Ishihara et al. |
| 2015/0035731 | A1 | 2/2015 | Wang et al. |
| 2015/0091787 | A1 | 4/2015 | Ohmae et al. |
| 2015/0153026 | A1 | 6/2015 | Chen |
| 2015/0155435 | A1 | 6/2015 | Nei |
| 2015/0179873 | A1 | 6/2015 | Wunderer et al. |
| 2015/0187258 | A1* | 7/2015 | Lee ............ G06K 9/00604 345/207 |
| 2015/0348470 | A1 | 12/2015 | Wang et al. |
| 2015/0348504 | A1* | 12/2015 | Sakariya ............ G09G 3/2092 345/206 |
| 2016/0042704 | A1 | 2/2016 | Yin et al. |
| 2016/0086575 | A1* | 3/2016 | Loomis ............ G09G 5/10 345/589 |
| 2016/0240594 | A1 | 8/2016 | Zhu |
| 2016/0276416 | A1 | 9/2016 | Ma |
| 2016/0284766 | A1 | 9/2016 | Wang |
| 2017/0009971 | A1* | 1/2017 | Chan ............ H01L 25/0753 |
| 2017/0052605 | A1* | 2/2017 | Varaschin de Moraes ............ G06F 3/0346 |
| 2017/0084671 | A1 | 3/2017 | Hack et al. |
| 2017/0116937 | A1* | 4/2017 | Du ............ G09G 3/3644 |
| 2017/0148771 | A1 | 5/2017 | Cha et al. |
| 2017/0213502 | A1 | 7/2017 | Henry et al. |
| 2017/0250167 | A1 | 8/2017 | Bower et al. |
| 2018/0166512 | A1 | 6/2018 | Hack et al. |
| 2018/0211580 | A1 | 7/2018 | Su et al. |
| 2018/0211940 | A1 | 7/2018 | Henry et al. |
| 2018/0269268 | A1 | 9/2018 | Cai et al. |

FOREIGN PATENT DOCUMENTS

| | | |
|---|---|---|
| CN | 1949531 A | 4/2007 |
| CN | 101086821 A | 12/2007 |
| CN | 101262725 A | 9/2008 |
| CN | 101449382 | 6/2009 |
| CN | 101465400 A | 6/2009 |
| CN | 101465401 A | 6/2009 |
| CN | 102340683 A | 2/2012 |
| CN | 102354702 A | 2/2012 |
| CN | 102593148 A | 7/2012 |
| CN | 202855738 U | 4/2013 |
| CN | 103366683 | 10/2013 |
| CN | 103367552 A | 10/2013 |
| CN | 103811593 A | 5/2014 |
| EP | 0809420 A1 | 11/1997 |
| EP | 2011153 | 1/2009 |
| JP | H08-137413 A | 5/1996 |
| JP | 2000352678 A | 12/2000 |

(56) References Cited

FOREIGN PATENT DOCUMENTS

| | | |
|---|---|---|
| JP | 2005-274777 A | 10/2005 |
| JP | 2007-163872 A | 6/2007 |
| JP | 2008-537804 A | 9/2008 |
| JP | 2009-508171 A | 2/2009 |
| JP | 2009-533810 A | 9/2009 |
| JP | 2011-186439 A | 9/2011 |
| JP | 2013-041014 A | 2/2013 |
| KR | 2001/0004905 A | 1/2001 |
| WO | WO 2012/077601 A | 6/2012 |
| WO | WO 2011/145174 A | 7/2013 |
| WO | WO 2016/016461 | 2/2016 |

OTHER PUBLICATIONS

Japan Patent Office, Office Action, JP Patent Application No. 2017-521543, dated May 7, 2019, 11 pages.

Chinese First Office Action, Chinese Application No. 201580070120.1, dated Oct. 24, 2018, 6 pages (with concise explanation of relevance).

PCT International Search Report and Written Opinion, PCT/EP2015/074546, dated Dec. 22, 2015, 14 pgs.

Chinese National Intellectual Property Administration, Office Action, Chinese Application No. 2015/800666212, dated Nov. 13, 2015, 16 pages.

European Patent Office, European Patent Office Action, European Patent Application No. 15784375.6, dated May 23, 2019, 10 pages.

Chinese Patent Office, Office Action, Chinese Patent Application No. 201580066621.2, dated Dec. 2, 2020, eight pages.

European Patent Office, Summons to Attend Oral Proceedings, European Patent Application No. 15784374.9, Nov. 26, 2020, seven pages.

The Japan Patent Office, Office Action, Japanese Patent Application No. 2019-202153, dated Oct. 27, 2020, seven pages.

\* cited by examiner

SUB-PIXEL FOR A DISPLAY WITH CONTROLLABLE VIEWING ANGLE

CROSS REFERENCE TO RELATED APPLICATIONS

This application is a National Phase application of International Application No. PCT/EP2015/074545, filed Oct. 22, 2015, which claims the benefit of United Kingdom Application No. GB1418810.6, filed Oct. 22, 2014, which are incorporated herein by reference in their entirety.

TECHNICAL FIELD

This invention relates to a display and to pixels and sub pixels for an optical display device.

BACKGROUND

A category of display technology called the ILED (Inorganic Light Emitting Diode) display is an alternative to the better known LCD (Liquid Crystal Display) and the OLED (Organic Light Emitting Diode) displays. An ILED display does not have many of the negative qualities of LCD or OLED displays as its display sub pixels are based on ILED light sources and has all the advantages of this class of device. This results in a display that has better performance characteristics than an OLED type direct view display as well as the robustness, long-life and stability that is inherent to ILED technology.

ILED devices may be controlled and driven via a number of methods. An example of a drive scheme includes the mounting of the devices on an active matrix incorporating thin-film technology (TFT). TFT includes metal oxide and amorphous silicon based transistors. This active matrix is also known as the backplane. ILED devices are currently driven and as such are compatible with OLED type TFT drivers. Other methods include using passive matrix drivers or the packaging of the light sources with monolithic drive circuits.

The current state of the art comprises of the arrangement of R, G and B display sub pixels to form a single display pixel. In a typical configuration for an ILED display, R, G and B chips are packed together to provide the necessary light for each pixel of the display. In this example, each R, G and B chip has one emitting area per chip or, more generally, the whole active area of the chip illuminates to emit light. These are termed Single Element Chips (SECs).

Of central importance in the efficient performance of ILED devices is the ability to extract the maximum amount of generated light for the LED material to the surrounds. In the majority of cases, this results in the light leaving the device in a randomised manner. The light extracted in this manner can be shown to have a Lambertian emission profile with a half width half maximum of 60°. It is also possible to extract light efficiently with a narrower beam profile. An example of same can be seen in U.S. Pat. No. 7,518,149.

When ILED devices are used in an ILED type display, the viewing angle of the display is largely dictated by the emission profile of the ILED device. The various layers within the display stack (such as a touch screen, circular polariser, cover glass etc.) will have an effect but this will not be as large as that of the initial emission angle.

In typical display products, a very narrow viewing angle is not desirable and has many drawbacks. Examples include the inability of multiple viewers to view the screen simultaneously and the inability to quickly view the screen without having to move it to an optimum position. A narrow viewing angle is beneficial in applications such as privacy display.

For the above reasons, standard displays have wide viewing angles. Indeed, a display with a wide viewing angle is seen as an important selling point. However, the amount of light required for a display over wide angles is significantly greater than of a display with a narrow viewing angle. Indeed, to a first order, the viewing angle is directly related to the power consumption of the display. Since the display is the primary source of power consumption, the requirements for an excellent display have two contrasting requirements: a wide viewing angle and minimal power consumption.

The viewing angle of a display is one of the most important features. A wide viewing angle is required for most devices—especially if they are regularly viewed by more than one person. However, the need to produce light over a wide set of angles results in increased power consumption.

SUMMARY

An ILED display consists of an array of ILED elements. The viewing angle of the display is dependent to some degree on the emitting angle of the ILED elements. A wide viewing angle requires more power than a narrow viewing angle for the same light output. However, a narrow viewing angle is less commercially attractive. By using ILED elements that have two different emitting angles the viewing angle of the display can be changed dynamically. This will provide for a display that has a commercially attractive viewing angle and can be driven in a very power efficient mode.

According to a first aspect, there is provided a sub-pixel for an LED display, the sub-pixel comprising a first light emitting device having a first emission beam angle and a second light emitting device having a second beam angle, the second emission beam angle being different to the first emission beam angle.

The first and second light emitting devices may be configured for selective operation for adjusting a light emission profile of a display. A light emission profile of a display may comprise a viewing angle of the display.

As an option, the first and second light emitting devices are selected from any of an LED, an inorganic LED, and an organic LED.

As an option, the first light emitting device is a first Single Element Chip and the second light emitting device is a second Single Element Chip. Alternatively, the first light emitting device is a first Addressable Array Element on an Addressable Array Chip and the second light emitting device is a second Addressable Array Element on the Addressable Array Chip.

As an option, the first and second emission beam angles are determined by any of:
a coating;
a lens;
surface texturing;
a mesa shape; and
contacts.

As an option, an emission beam profile of any of the first and second light emitting devices is non-isotropic.

According to a second aspect, there is provided a display comprising a plurality of sub-pixels as described above in the first aspect.

The display optionally comprises a modifying layer overlaid on the display, the modifying layer arranged to modify light from the plurality of sub-pixels.

The display optionally comprises a control device arranged to selectively control illumination of sub-pixels of the plurality of sub-pixels. The control system is optionally selected from any of a passive matrix and an active matrix. The control system optionally further comprises a user input device configured to receive an input from a user relating to a desired light emission profile from the display. As a further option, the control system further comprises a sensor configured to receive an input, and the control system is configured to adjust a desired light emission profile from the display in response to the sensor input. As a further option, the control system is configured to adjust a desired light emission profile from the display dependent on a number of users of the display. As a further option, the control system is configured to adjust a desired light emission profile from the display dependent on a type of content of the display. As a further option, the control system is configured to adjust a desired light emission profile from the display dependent on any of a location and an orientation of the display. As a further option, the control system is configured to adjust a desired light emission profile from the display dependent on ambient light conditions.

According to a third aspect there is provided a method of controlling an optical display device, the optical display device comprising a plurality of sub-pixels, each sub-pixel of the plurality of sub-pixels comprising a first light emitting device having a first emission beam angle and a second light emitting device having a second beam angle, the second emission beam angle being different to the first emission beam angle, the method comprising selectively controlling a power to the first light emitting device and the second light emitting device.

According to a fourth aspect there is provided a computer device comprising:
- an output connecting the computer device to the display and configured to control a desired light emission profile from the display; and
- a processor configured to determine the desired light emission profile from the display, the light emission profile relating to an emission beam angle of sub-pixels of the display.

As an option, the processor is arranged to selectively illuminate a first light emitting device of a sub-pixel, the first light emitting device having a first emission beam angle, and a second light emitting device of the sub-pixel, the second light emitting device having a second beam angle, the second emission beam angle being different to the first emission beam angle.

According to a fifth aspect there is provided a computer program comprising computer readable code which, when run on a computer device, causes the computer device to determine a desired light emission profile from the display, the light emission profile relating to an emission beam angle of sub-pixels of the display.

According to a sixth aspect there is provided a computer program product comprising a computer readable medium and a computer program according to claim 20, wherein the computer program is stored on the computer readable medium.

As an option, the computer readable medium is a non-transitory computer readable medium.

DETAILED DESCRIPTION

The following abbreviations and definitions are used in the following description:

Light Emitting Diode (LED) A semiconductor device which produces light when the appropriate electrical bias is provided. It is noted that a micro-LED (µLED) may be considered a type of LED.

Emitter Any light emitting source, generally an LED. It is noted that a µLED emitter may be an emitter and may comprise only a part of a µLED device.

LED chip A piece of semiconductor material that can generate light and has been singulated from a semiconductor wafer on which it has been fabricated.

Single Emitter Chip (SEC) An LED chip with only 1 emitting region (or emitter). Generally the whole chip will illuminate, although this may not be the case in respect of µLEDs.

Addressable Array Chip (AAC) An LED chip which has more than one distinct light generating region (or emitter) that can be independently addressed.

Addressable Array Element (AAE) An independently addressable emitting area (or emitter) in an Addressable Array Chip.

Non-addressable Array Element (NAC) An LED chip which has more than one distinct light generating region (or emitter) which cannot be independently addressed.

Display Pixel: A component of a display that is used to build the total image. It generally consists of R, G and B sub-pixels which can be independently controlled to produce a range of colours.

Display Sub-Pixel: A sub-section of the Display Pixel which typically comprises a single colour (generally R, G or B).

Figure 1:
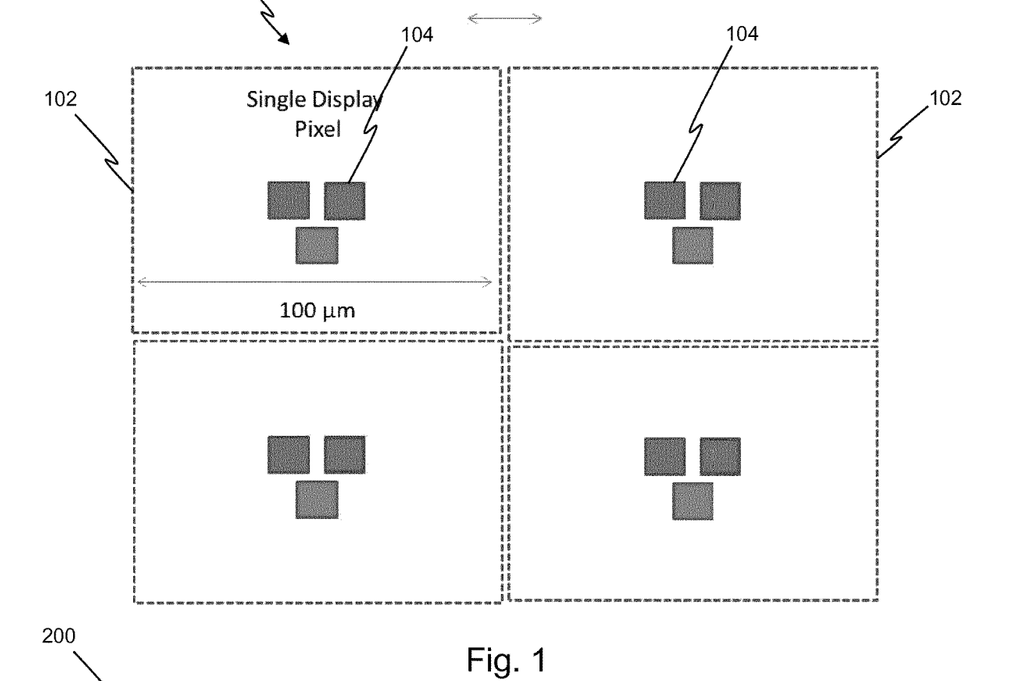
FIG. 1 illustrates schematically a display comprising a plurality of pixels.

Referring to FIG. 1, there is shown a display 100 comprising a plurality of pixels 102 with individual Single Emitter Chips in each display sub-pixel 104. Each sub pixel 104 may have two light emitting devices (not shown in FIG. 1) to provide redundancy in the event of one of the light emitting devices failing.

Figure 2:
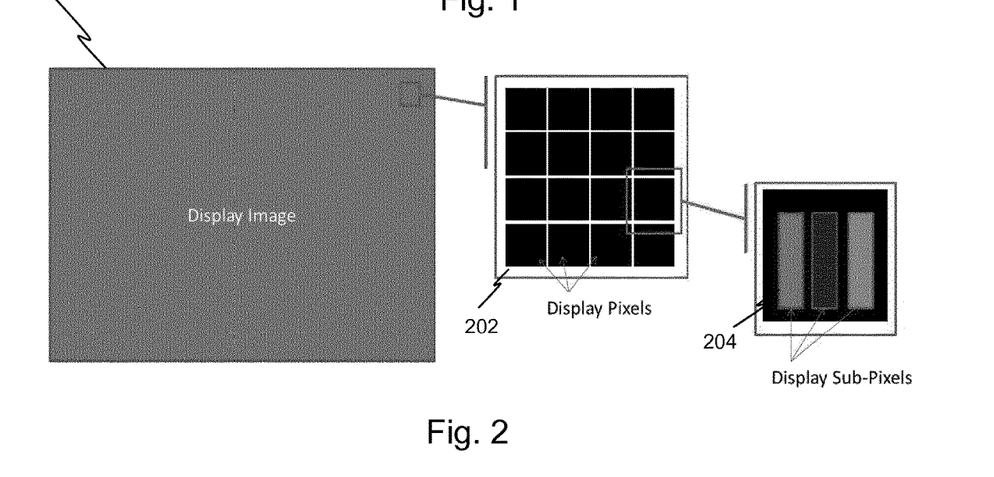
FIG. 2 illustrates schematically various components of a display.

FIG. 2 illustrates schematically the various components of a display. A display image 200 is made up of display pixels 202, and a display pixel 202 is made up of display sub-pixels (typically RBG) 204.

Figure 3:
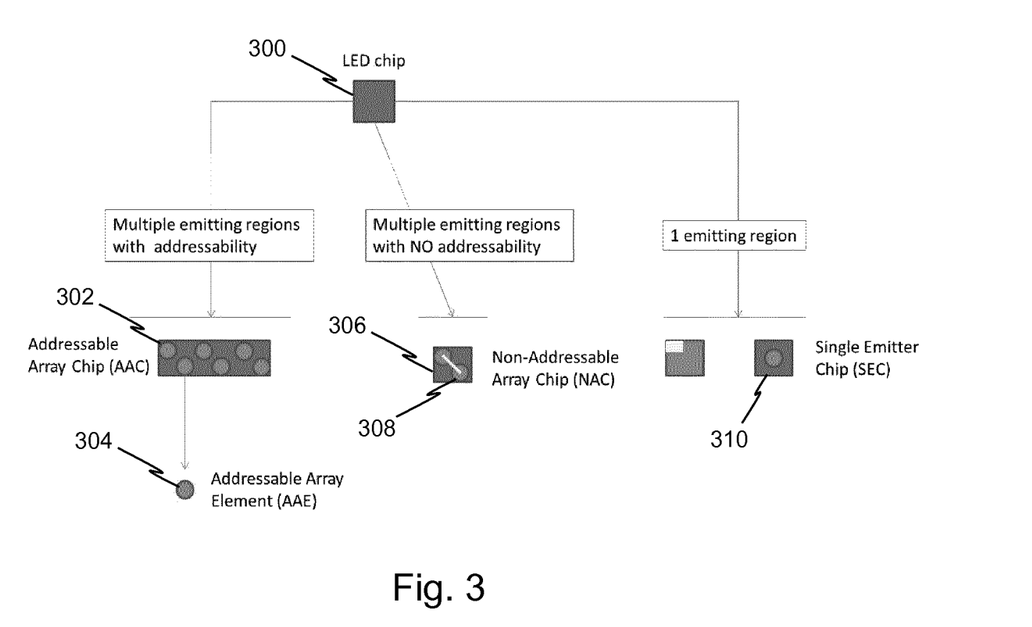
FIG. 3 illustrates schematically a relationship between various ILED chip types.

FIG. 3 illustrates schematically a relationship between various ILED chip types. From FIG. 3, it can be seen that an LED chip 300 may have at least three different types: an addressable array chip 302, which comprises a plurality of addressable array elements (or emitters) 304; a non-addressable array chip 306, which comprises a plurality of array elements (or emitters) 308 that cannot be addressed individually; and a SEC 310.

There is described a display design based on the design and assembly of ILED chips such that viewing angle of the display can be dynamically changed and will allow for significant reducing in display power consumption when a wide viewing angle is not required.

A display typically comprises a large array of individual display components that can be selectively illuminated—see FIG. 1. These components are referred to as Display Pixels. In a multi-colour display the smaller components related to the different colours are called display sub-pixels. In general these different colours are red, green and blue (R, G, and B).

For an LCD display, the display sub-pixels are created by colour filters and a liquid crystal optical element to selectively allow the transmission of light from a white LCD backlight based on the pixel state. In an ILED display, individually addressable R, G and B ILEDs are selectively illuminated based on the pixel state. No colour filter or liquid crystal is required. As the size or resolution of a display is increased the total number of LED chips required increases. The pixels which are illuminated are selected by the backplane.

Figure 4:
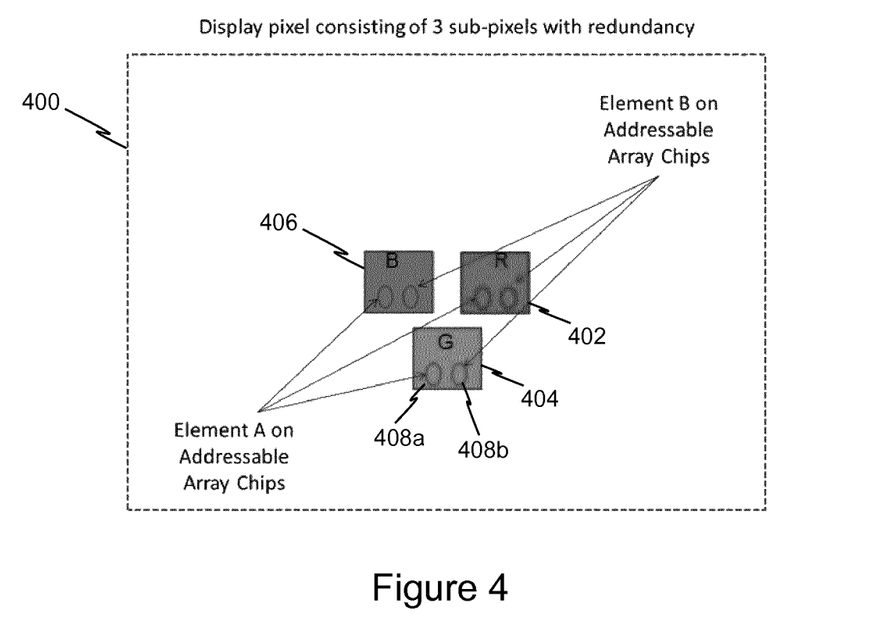
FIG. 4 illustrates schematically an exemplary ILED layout.

As shown in FIG. 4, an ILED display pixel 400 comprises individual emitting ILED devices in R 402, G 404 and B 406 (referred to individually as the display sub-pixels). These are Addressable Array Chips (AACs). In an exemplary ILED display, the light extracted from these ILED devices is random and may result in significant losses in trapped light and also a display with a wide viewing angle. Some of the light extracted from the LEDs may be trapped within the display due to speculative reflections at interfaces or other optical effects. These result in a reduction in display efficiency and may also contribute to pixel crosstalk or pixel blur.

A more collimated emission beam from the ILED source will reduce the magnitude of the reflections and other artefacts. However, as noted above, such a narrow viewing angle in a display is less desirable in certain applications from a consumer point of view.

In exemplary displays, two ILED emitters are placed at each display sub-pixel 402, 404, 406—one with a wide beam profile and the other with a narrow beam profile. The relative drive current of each of these devices will largely dictate the viewing angle of the display. This will also dictate the power consumption. Specifically, referring to the green sub pixel 404, the sub pixel 404 comprises two emitters 408a, 408b. The two emitters 408a, 408b may be located on a single LED device or may be each located on different LED devices. The two emitters 408a, 408b are individually addressable such that one of the emitters may be turned on while the other is turned off. Similar arrangements may be present in each of the red 402 and blue 406 sub pixels. Further, a plurality (and in certain exemplary display all) of the remaining pixels in the display may have the same or a similar arrangement of sub pixels.

A number of exemplary method and apparatus comprise two ILED Elements placed together for each display sub-pixel to achieve performance benefits—namely the ability to provide lower power consumption or wide viewing angle based on user requirements and to provide a privacy function to a display. In one embodiment, two individual ILED chips per colour each with different beam angles are used for each display sub-pixel. For such a design, 4 contacts are required; one p and one n for each ILED chip in a sub pixel.

Shown in FIG. 4 is an overview of the ILED display pixel 400. Each display sub-pixel 402, 404, 406 contains at least one individual ILED emitter. The total number of display pixels 400 and hence display sub-pixels 402, 404, 406 is dictated by the size and resolution of the display. An example of an increasingly common display format for mobile phone devices is 1920×1080. In such a format the total number of display pixels 400 is 2,073,600. The total number of display sub-pixels 402, 404, 406 is 6,220,800. For a standard ILED type there would, therefore, be 6,220,800 individual Single Element Chips, assuming one chip for each sub pixel.

As noted above, a number of techniques are used to maximise the light extraction efficiency for ILED devices. These techniques generally result in light that is randomised from its light exiting surface. The light so produced may exit the ILED device equally in all directions although more commonly it is shared across five surfaces (a front surface and four side surfaces) with the back surface (which is mounted to the carrier) being highly reflective. The overall beam profile from such a device is dependent on the power escaping from the sides of the device relative to that from the front face.

In general the light from the front face will have a Lambertian profile e.g. a full width half maximum of 60°. Such devices when used in an ILED type display will result, to a first order, in a viewing angle of 60°. The power that is produced from the sides of the ILED chips may result in losses or pixel cross talk, as it is not emitted directly out of the ILED chip and, therefore, not directly emitted from the display. An exemplary method to overcome such issues includes the use of reflective banks in a carrier substrate on which ILED chips are located, such as patent application US20140159064. This is analogous to the use of secondary packaging in standard LED devices. These reflective banks are integrated as part of the TFT panel manufacturing process. There is some scope to vary the beam angle/viewing angle of the sub-pixels based on the design of the reflective banks. However, in reality, the ability to control the beam angle using reflective banks is limited by manufacturing techniques associated with TFT panel processing.

In exemplary methods and apparatus disclosed herein, the beam angle of an ILED emitter may be measured on a wafer on which it has been fabricated. This allows the relative viewing angles of displays manufactured using the ILED devices to be predictable, which is not achievable using current methods.

In exemplary displays, ILED devices are assembled in a display format such that the viewing angle of the display can be changed based on user requirements. This may be achieved by assembling a plurality of ILED devices within a sub pixel that have different emission beam profiles. A number of methods to produce such an assembly are outlined. In exemplary displays, ILED chips are used that are capable of producing light with a well-defined, narrow and/or controllable beam angle without the need for secondary optical components. Such a device is outlined in U.S. Pat. No. 7,518,149.

Figure 10:
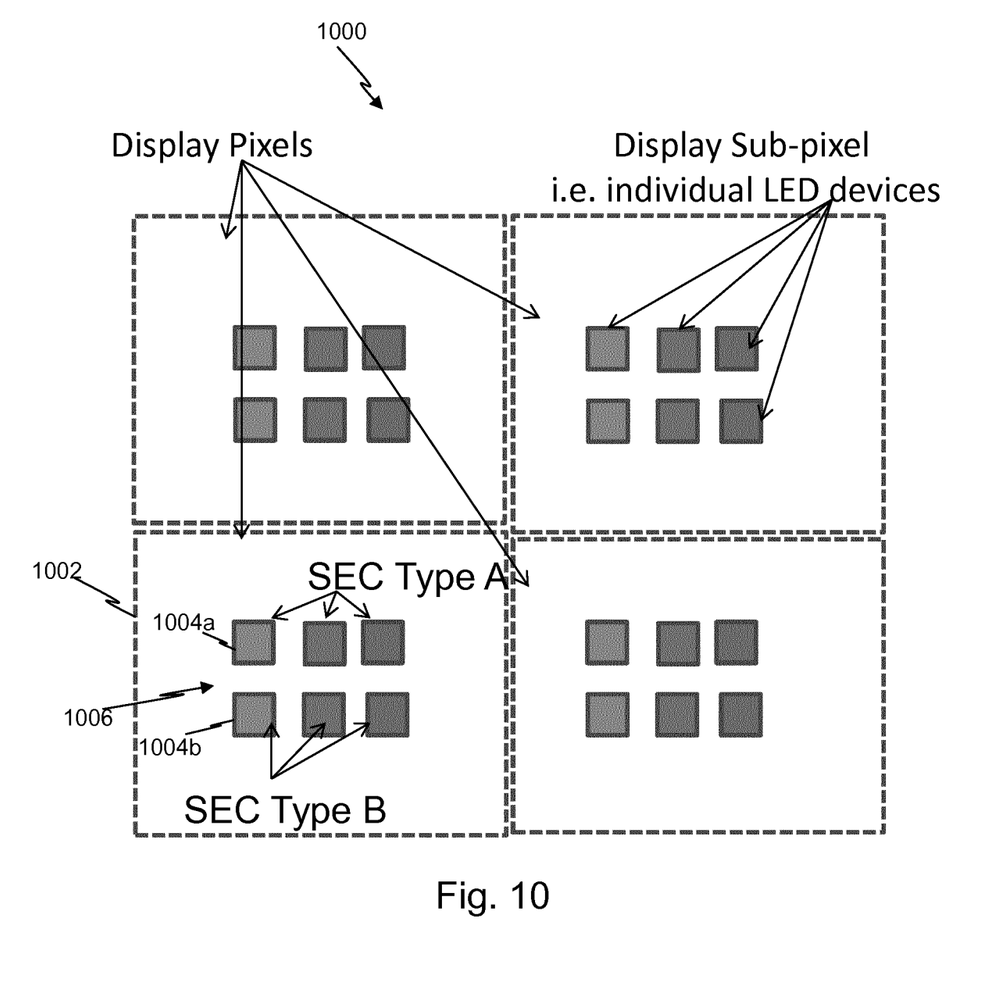
FIG. 10 illustrates schematically a display pixel with SECs of two emission angles used.

In one exemplary display, two ILED Single Element Chips are used for each display sub pixel. Both of these ILED SECs will have well-defined emission beam angle profiles that differ from each other. For example, with reference to FIG. 10, one ILED SEC (Type A) may have a beam angle of 60° (Half width half maximum). The other (Type B) may have a beam angle of 20°. In the exemplary display 900 of FIG. 10, each pixel 1002 comprises a plurality of LED emitters 1004a, b in each sub pixel 1006. A first LED emitter 1004a is a type A emitter and a second LED emitter 1004b is a type B emitter. The first LED emitter 1004a has a different emission angle to the second LED emitter 1004b. The two emitters 1004a, b are individually addressable such that one of the emitters 1004a, b can be illuminated when the other is not. In this way, the display 1000 may be configured to use either the first or the second LED emitter 1004a, b. If the same arrangement is used for a plurality of pixels (e.g., all pixels) 1000 in the display then the viewing angle of the display may be changed by switching between the sub pixel emitters 1004a, b. It is noted that whilst FIG. 10 shows two types of emitter having different beam angles, more types of emitter may be used.

When the display uses ILED SECs of Type A then, to a first approximation, the viewing angle will be 60°. When ILED SEC of Type B is used the viewing angle will be 20°. With Type B devices the power consumption for the display for a target forward luminance will be significantly reduced relative to that of Type A devices.

Figure 5:
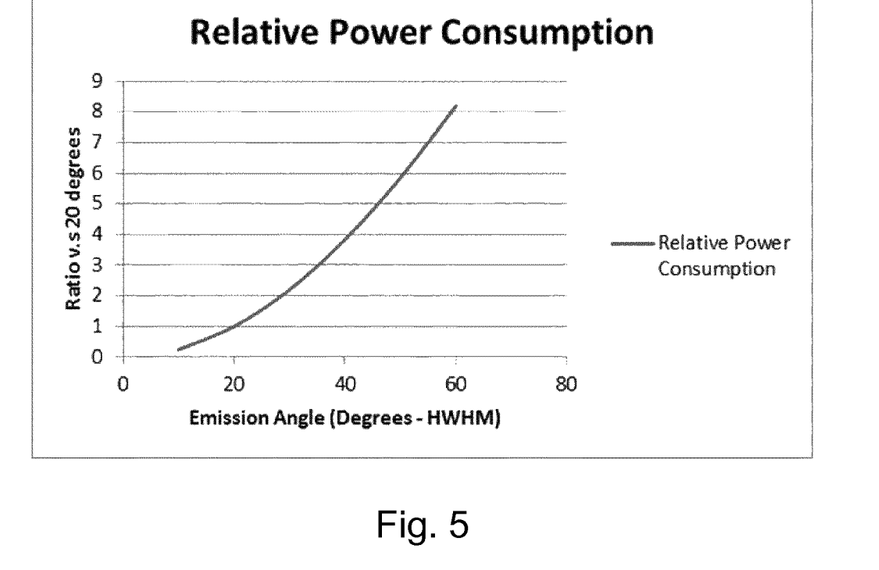
FIG. 5 is a graph showing the illumination area and the ratio of illumination area for various illumination angles.

Shown in FIG. 5 is the comparative light power required for various viewing angles. A device with 60° angle of emission (Half Width Half Maximum) requires more than 8× more light than a device with 20° half-angle emission to provide the same level of uniform illumination over its target area. This translates to 8x more power consumption, or conversely a display using a 20° half-angle emission will consume 8× less power. In addition, a reduced viewing angle restricts viewing of information displayed on the display by third parties outside the viewing angle, thereby providing increased security. Further, using the lower viewing angle setting allows increased brightness for the same power as a lower brightness using the wider viewing angle. This can be advantageous in bright ambient light conditions, such as in sunlight.

In another embodiment, only a single chip is used per colour/display sub-pixel. However, this chip will be an Addressable Array Chip and will contain two or more different Addressable Array Elements—emitting regions (or emitters) of which can be independently switched on or off. Each of these Addressable Array Elements will produce light from the ILED chip with different beam profiles. In such a display, three or more contacts are required—one for each p contact and one shared n contact.

A number of methods may be used to produce light from an Addressable Array Chip with two different beam profiles. It is generally recognised, as noted above, that producing light from an ILED device with good extraction efficiency and a controlled beam angle is more challenging than good extraction efficiency and a wide or random beam angle. Therefore, the use of devices such as that described in U.S. Pat. No. 7,518,149 may be used to provide a particular beam angle of emission. These devices are termed μLED devices herein and generally comprise a mesa structure and may be a type of ILED. References to ILEDs in this document may also be references to μLEDs.

Figure 6:
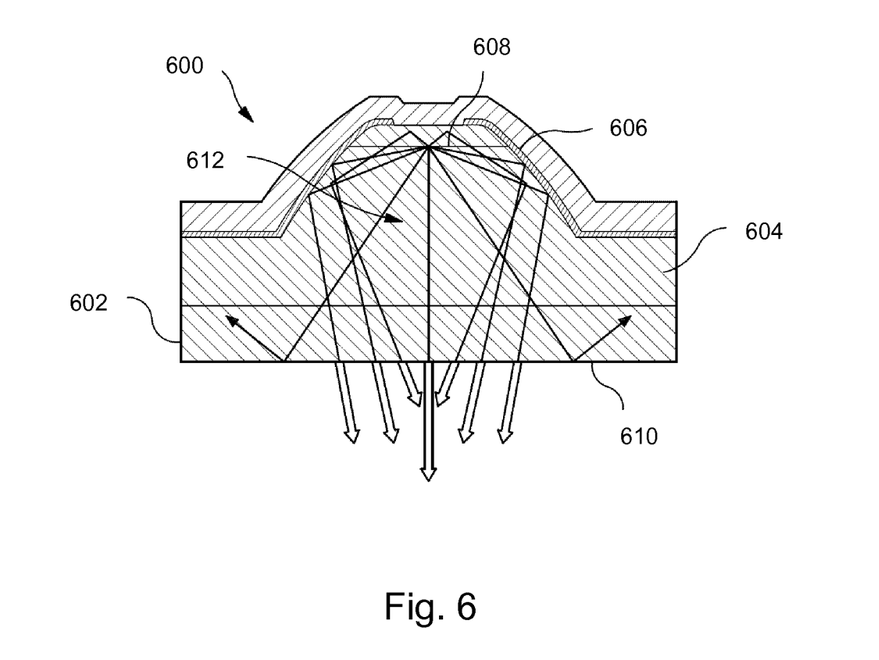
FIG. 6 illustrates an exemplary micro-LED.

FIG. 6 shows an exemplary μLED 600. The μLED 600 shown in FIG. 6 is the same or similar to that proposed in WO2004/097947 (also published as U.S. Pat. No. 7,518, 149) having a high extraction efficiency and outputting quasi-collimated light because of the parabolic shape. A substrate 602 has a semiconductor epitaxial layer 604 located on it. The epitaxial layer 604 is shaped into a mesa 606. An active (or light emitting) layer 608 is enclosed in the mesa structure 606. The mesa 606 has a truncated top, on a side opposed to a light transmitting or emitting face 610 of the μLED 600. The mesa 606 also has a near-parabolic shape to form a reflective enclosure for light generated within the μLED 600. The arrows 612 show how light emitted from the active layer 608 is reflected off the internal walls of the mesa 606 toward the light exiting surface 610 at an angle sufficient for it to escape the μLED device 600 (i.e. within an angle of total internal reflection).

There are a number of methods of increasing the beam angle of collimated (or partly collimated) light source—both on the chip and subsequently. In one embodiment, the surface of the ILED exit face may be roughened. This results in scattering of the light to wider angles as it leaves the chips. For a monolithic array it may be important that such roughening is confined to the area that is illuminated by the emitter for which the beam angle is to be modified. Therefore selective roughening of the ILED chip's light emitting surface may be required.

In another embodiment, selective etching/shaping of the light exiting surface may be used. This selective etching can be used to provide a particular shape (e.g. convex and concave) to the light emitting surface of an ILED in order to narrow the beam profile of one emitter and, using a different shaping, increase the beam angle (and possibly extraction efficiency) of another. It is noted that the ability to control the light within the ILED chips, and hence selectively illuminate the feature which may vary the beam profile, is a consideration in the successful functioning of the Addressable Array Chips.

In another embodiment, structuring of the emission surface may be used.

In another embodiment, the ILED device includes an optical component, such as a polymeric lens, which changes the beam profile as the light exits the chip.

In another embodiment, materials may be deposited on the light exiting surface such that they vary the emitted beam angle. These materials include, but are not limited to, filters, anti-reflection coatings or oxide based materials.

In another embodiment, the ILED emitter may be designed such that the emission profile from the device is not isotropic.

In another embodiment, the surface may be modified using any technique such that the emitted light is no longer isotropic.

In another embodiment, more than two Elements may be used in each Addressable Array Chip for each display sub-pixel. Each of these may provide a different beam profile. This would allow for additional control of the viewing angle of the display.

Figure 7:
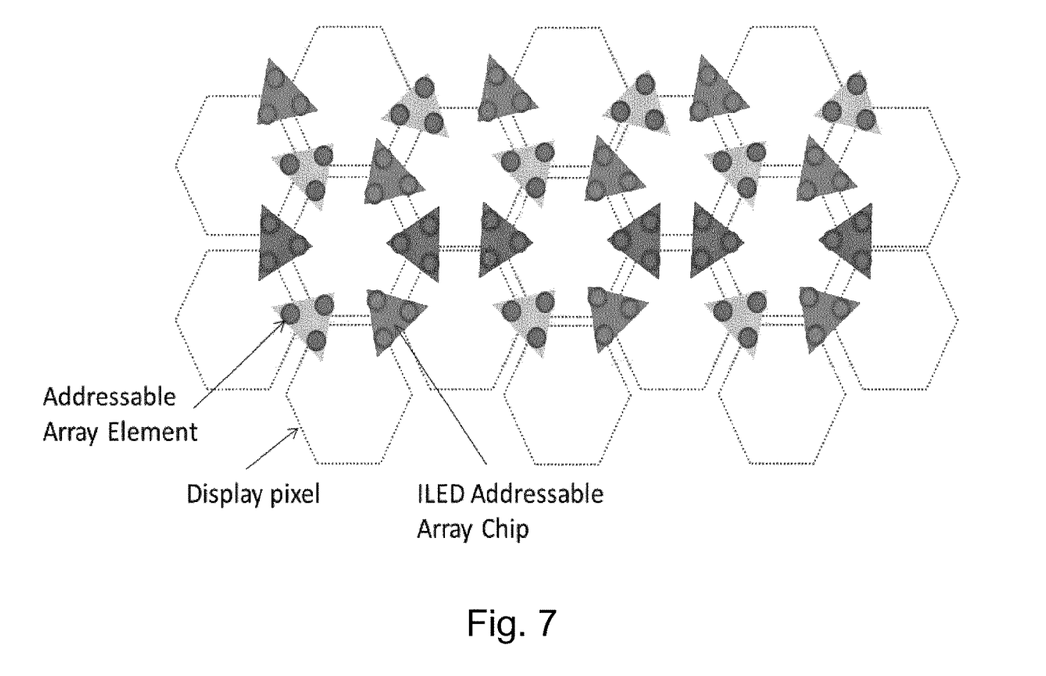
FIG. 7 illustrates schematically sharing of Addressable Array Elements across multiple display pixels using Addressable Array Chips.

In another embodiment, the display sub-pixel may be formed using Elements (or emitters) which are on different Addressable Array Chips. Each of these Addressable Array Chips may contain Elements (or emitters) with one, or more than one, emission beam profiles. The emitters on each monolithic array can be shared by more than one display sub-pixel. A scheme for doing this is shown in FIG. 7.

In another embodiment, all emitters on the Addressable Array Chip produce narrow emission profiles. A secondary layer that is not part of the Addressable Array Chip may then be used to increase the beam angle of a selected number of these beam profiles. The overall viewing angle of the display can then be controlled by selecting Elements (or emitters) which are modified or not affected by the secondary layer.

In another embodiment, different parts of the screen may have different viewing angles. This may be decided based on the contents or selected by the user. For example, areas of the display that the user would like to keep private may have a narrow viewing angle.

In another embodiment, the relative power of the emitters with different beam angles is controlled and modified such that the viewing angle is constantly variable across a wide number of viewing angles. That is, it is possible to, for example, drive A (angle 20) at 10% and B (angle 60) at 90% to get a viewing angle of 50 degrees. It is also possible to drive, for example, A at 50% and B at 50% to obtain a viewing angle of 40 degrees. Other ratios of drive current will be apparent to the skilled person.

In another embodiment, the light from the Addressable Array Chips is coupled into an optical film such that this film will position the light appropriately within the display pixel and may or may not change the beam angle of the device.

The selection of the display viewing angle may be made by the user or automatically by the operating system of the device in which the display is used. The former can be referred to as Manual Viewing Angle Control (m-vac) while the later can be termed Automatic Viewing Angle Control (a-vac). There are a number of instances where the control system could automatically choose the viewing angle for the optimum balance of power consumption or viewing angle. This could be decided based on the type of information to be displayed, the location of the device or using sensors to assess the number of people interacting with the system.

In one instance of a-vac, the system sensor such as the camera can measure the number of users viewing or in a position to view the display and adjust the viewing angle accordingly.

In another instance of a-vac, the viewing angle is reduced if the type of message or sender is marked as private such that it is not easily viewable by a person who is not directly in front of the display.

In another instance of a-vac, the viewing angle is increased for content that may be viewed by multiple people so as a film or video but reduced for other types of media that is not consumed by multiple people as once such as a business document.

In another instance of a-vac, the viewing angle may be dictated by the position or location of the display. For example, if it is left flat on a table the display may automatically use a wide viewing angle as it is likely that the user will not be directly viewing it.

In another instance of a-vac, the viewing angle may be decided by the orientation of the display i.e. landscape or portrait.

In another instance, a-vac may be over-ridden by m-vac such that the user can select the preferred viewing angle for all content.

In another instance, a portion of the display may have a wide viewing angle while another portion may have a narrow viewing angle.

A factor in the viability of a display is the total cost. For the current invention, two emitters are used for each display sub-pixel. Such a design has the potential to increase the cost of the display. However, it should be noted that a second emitter may be required at each display sub-pixel in any event as a redundancy measure to account for device failure. Therefore, the second pixel—which in the current invention has a different beam angle from the first—is required in the design. In certain embodiments above, the design is such that the material requirements and number of interconnections is not twice that of a single pixel device.

ILED devices may be controlled and driven via a number of methods. An example of a drive scheme includes the mounting of the devices on an active matrix incorporating thin-film technology (TFT). TFT includes metal oxide and amorphous silicon based transistors. This active matrix is also known as a backplane. ILED devices are current driven and as such are compatible with OLED type TFT drivers. Other methods include using passive matrix drivers or the packaging of the light sources with monolithic drive circuits.

A method for the user to toggle between privacy mode (narrow viewing angle) to standard mode (wide viewing angle) will be provided by the operating system.

Figure 8:
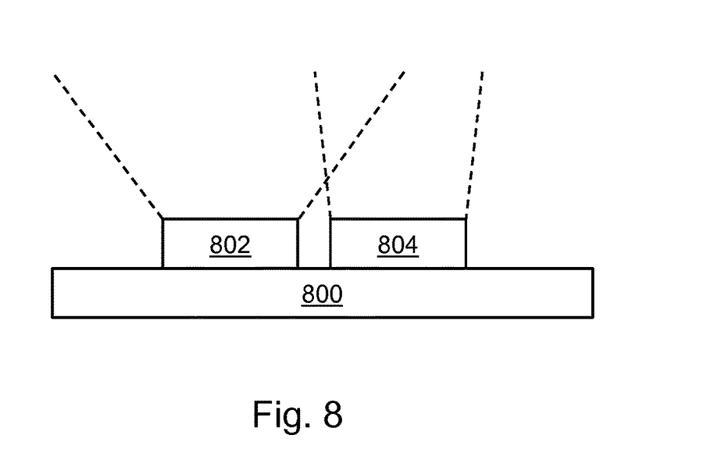
FIG. 8 illustrates schematically a cross-section view of an exemplary sub-pixel comprising two light emitting devices.

Turning to FIG. 8, there is illustrated schematically a sub-pixel 800 that comprises a first light emitting device 802 and a second light emitting device 804. The beam angle of the first light emitting device 802 is wider than the beam angle of the second light emitting device 804, meaning that the first light emitting device 802 consumes more power but allows a display to be viewed from a wider viewing angle. The narrow beam angle of the second light emitting device 804 reduces power consumption and also allows a user to view a display in 'privacy' mode. An operating system or computer programme may control the amount of power to each light emitting device, thereby controlling the viewing angle and power consumption of the display. As described above, the light emitting devices may be on separate chips or the same chip. Note that each sub-pixel may be provided with more than two light emitting devices with different beam angles, allowing a greater degree of control over the viewing angle of a display.

Figure 9:
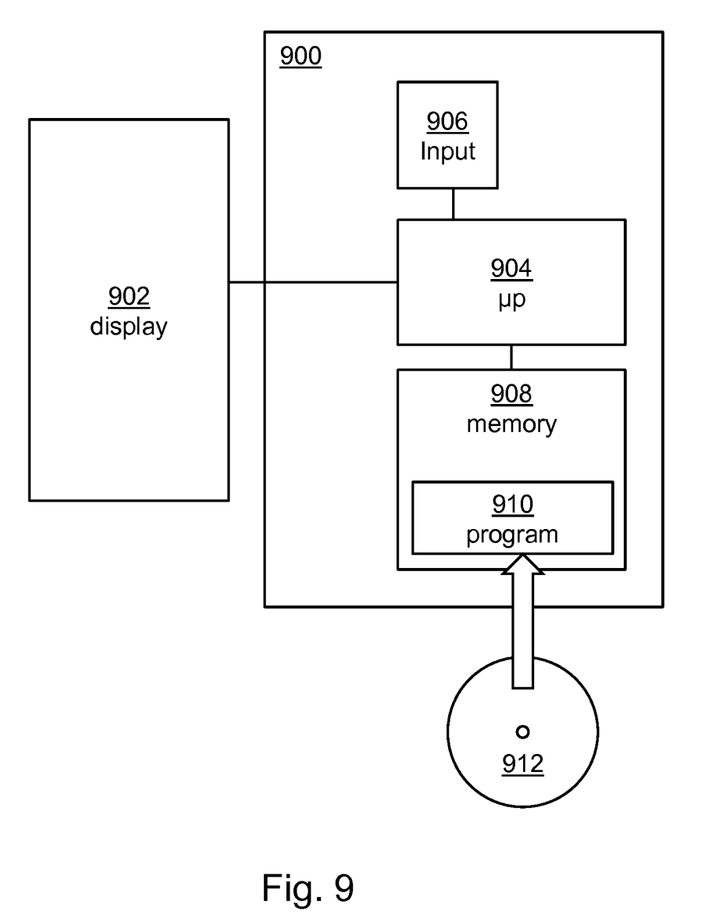
FIG. 9 illustrates schematically in a block diagram an exemplary computer device.

FIG. 9 illustrates schematically in a block diagram of an exemplary computer device 900. The computer device is connected to a display 902 that comprises sub-pixels as shown in FIG. 8. A processor 904 controls the display and selectively provides power to the sub-pixels of the display to affect the beam angle and hence the viewing angle of the display 902. An input 906 is provided (for example, a user input or an ambient light sensor) that provides data from which the processor 904 determines the required viewing angle of the display 902. A non-transitory computer readable medium in the form of a memory 908 is provided, which is used for storing a program 910 which, when executed by the processor 904, causes the processor 904 to behave as described above. Note that the program may be provided from an external computer readable medium 912, such as a CD, a flash drive, a carrier wave and so on.

Whilst specific embodiments of the invention are described above, it will be appreciated that a number of modifications and alterations may be made thereto without departing from the scope of the invention as defined in the appended claims.

Numbered Clauses

1. An ILED type display in which the radial distribution of light emitted from the display may be varied and as such the viewing angle of the display can be changed.

2. An ILED type display from which the radial distribution of light may be varied and consisting of the following:
a. A plurality of ILED chips
b. A portion of the plurality of ILED chips are designed to have emission beam profiles that are substantially different from the others.
c. A method of selectively addressing the ILED chips.

3. As clause 2, where the ILED chips are individual devices that have a single emitting region.

4. As clause 2, where the ILED chips are Addressable Array Chips and the Elements in the array are designed to have different beam angles.

5. As clause 2, where the ILED chips are Addressable Array Chips containing 2 or more Elements and all Elements are illuminating the same display sub-pixel.
6. As clause 2, where the ILED chips are Addressable Array Chips and the Elements on the same Addressable Array Chips may illuminate different display sub-pixels.
7. As clause 2, where the ILED chips have a coating, lens or other type of component integrated to vary the beam angle.
8. As clause 2, where the ILED chips are Addressable Array Chips and a coating, lens or other optical components is used to selectively modify the beam angle of selected Elements.
9. As clause 2, where the light exiting surface of the chips are textured such that the beam profile of the light is selectively modified.
10. As clause 2, where the emission profile from the ILED devices is non-isotropic by design.
11. As clause 2, where an optical film or sheet is integrated over the ILED chips such that the light can be positioned or otherwise modified within the display.
12. As clause 2, where an optical film or sheet is integrated over the ILED chips such that the light from ILED devices is selectively modified.
13. As clause 2, where the design of the mesa shape or contacts or size is varied in a predetermined manner to change beam profile.
14. As clause 1, where the display also includes electronic control system.
15. As clause 14, where the electronic control is a passive matrix.
16. As clause 14, where the electronic control is an active matrix.
17. A display where the radiant distribution of light exiting from the display may be dynamically varied by the user.
18. A display where the radiant distribution of light exiting from the display may be varied automatically by the operating system.
19. As clause 18, where the operating system varies the viewing angle based on information received from a sensor.
20. As clause 18, where the operating system varies the viewing angle based on the number of people viewing the display.
21. As clause 18, where the operating system varies the viewing angle based on the type of content on the display.
22. As clause 18, where the operating system varies the viewing angle based on location of the display, for example, flat on a table.
23. As clause 18, where the operating system varies the viewing angle based on orientation of the display, for example, portrait or landscape.
24. As clause 18, where the operating system varies the viewing angle based on ambient lighting conditions.

The invention claimed is:

1. A light emitting diode (LED) display, comprising:
 a first inorganic light emitting diode (ILED) array chip having a triangular shape and including first ILED emitters, the first ILED emitters configured to emit light having different emission beam angles with respect to each other and at a first wavelength, the first ILED emitters each arranged to form a sub-pixel of a different pixel; and
 a second ILED array chip having a triangular shape and including second ILED emitters, the second ILED emitters configured to emit light having different emission beam angles with respect to each other and at a second wavelength, the second ILED emitters each arranged to form a sub-pixel of a different pixel, a first ILED emitter of the first ILED array chip arranged to form a first sub-pixel of a first color of a pixel and a second ILED emitter of the second ILED array chip arranged to form a second sub-pixel of a second color of the pixel.

2. The display according to claim 1, wherein the first ILED emitters are each a first Addressable Array Element, the first ILED array chip is a first Addressable Array Chip, the second ILED emitters are each a second Addressable Array Element, and the second ILED array chip is a second Addressable Array Chip.

3. The display according to claim 1, wherein a first emission beam angle of the first ILED emitter is caused by at least one of:
 a coating on the first ILED emitter;
 a lens on the first ILED emitter;
 surface texturing of the first ILED emitter;
 a mesa shape of the first ILED emitter; or
 a contact of the first ILED emitter.

4. The display according to claim 1, wherein an emission beam profile of any of the first and second ILED emitters is non-isotropic.

5. The display according to claim 1, further comprising a modifying layer overlaid on the a first ILED emitter of the first ILED array chip, the modifying layer arranged to modify emission beam angle of light from the first ILED emitter.

6. The display according to claim 1, further comprising a control system configured to selectively control illumination of the first ILED emitters and the second ILED emitters for adjustment of a light emission profile of the display.

7. The display according to claim 6, wherein the control system includes a passive matrix or an active matrix.

8. The display according to claim 6, wherein the control system further comprises a user input device configured to receive an input from a user to select the light emission profile.

9. The display according to claim 6, wherein the control system further comprises a sensor configured to receive an input, and the control system is configured to adjust the light emission profile in response to the sensor input.

10. The display according to claim 6, wherein the control system is configured to adjust the light emission profile dependent on a number of users of the display.

11. The display according to claim 6, wherein the control system is configured to adjust the light emission profile dependent on a type of content of the display.

12. The display according to claim 6, wherein the control system is configured to adjust the light emission profile dependent on any of a location and an orientation of the display.

13. The display according to claim 6, wherein the control system is configured to adjust the light emission profile dependent on ambient light conditions.

14. A method of controlling an optical display device, the optical display device comprising a pixel including a first sub-pixel and a second sub-pixel, the method comprising:
 selectively providing power to first inorganic light emitting diode (ILED) emitters of a first ILED array chip having a triangular shape, the first ILED emitters configured to emit light having different emission beam angles with respect to each other and at a first wavelength, the first ILED emitters each arranged to form a sub-pixel of a different pixel; and
 selectively providing power to second ILED emitters of a second ILED array chip having a triangular shape, the second ILED emitters configured to emit light having different emission beam angles with respect to each other and at a second wavelength, the second ILED emitters each arranged to form a sub-pixel of a different pixel, a first ILED emitter of the first ILED array chip arranged to form the first sub-pixel of a first color of the pixel and a second ILED emitter of the second ILED array chip arranged to form the second sub-pixel of a second color of the pixel.

15. A computer device comprising:
a display, including:
- a first inorganic light emitting diode (ILED) array chip having a triangular shape and including first ILED emitters, the first ILED emitters configured to emit light having different emission beam angles with respect to each other and at a first wavelength, the first ILED emitters each arranged to form a sub-pixel of a different pixel;
- a second ILED array chip having a triangular shape and including second ILED emitters, the second ILED emitters configured to emit light having different emission beam angles with respect to each other and at a second wavelength, the second ILED emitters each arranged to form a sub-pixel of a different pixel, a first ILED emitter of the first ILED array chip arranged to form a first sub-pixel of a first color of a pixel and a second ILED emitter of the second ILED array chip arranged to form a second sub-pixel of a second color of the pixel; and
a processor configured to selectively provide power to the first ILED emitters and the second ILED emitters for adjustment of a viewing angle of the display.

* * * * *